United States Patent
Horiuchi

(10) Patent No.: US 7,313,021 B2
(45) Date of Patent: Dec. 25, 2007

(54) NONVOLATILE MEMORY CIRCUIT

(75) Inventor: Tadahiko Horiuchi, Isehara (JP)

(73) Assignee: NSCore Inc., Fukuoka (JP)

( * ) Notice: Subject to any disclaimer, the term of this patent is extended or adjusted under 35 U.S.C. 154(b) by 0 days.

(21) Appl. No.: 11/239,802

(22) Filed: Sep. 30, 2005

(65) Prior Publication Data

US 2006/0092701 A1     May 4, 2006

(30) Foreign Application Priority Data

Sep. 30, 2004  (JP) .............................. 2004-285730
Sep. 29, 2005  (JP) .............................. 2005-284910

(51) Int. Cl.
   *G11C 11/34*     (2006.01)
   *G11C 11/00*     (2006.01)

(52) U.S. Cl. ........................... 365/185.05; 365/185.07; 365/154; 365/156; 365/230.05; 365/230.06

(58) Field of Classification Search ............... 365/154, 365/156, 230.05, 230.06, 185.07, 185.05; 257/371
See application file for complete search history.

(56) References Cited

U.S. PATENT DOCUMENTS

| | | | |
|---|---|---|---|
| 3,636,530 A | | 1/1972 | Mark et al. |
| 4,419,744 A | | 12/1983 | Rutter |
| 5,334,870 A | * | 8/1994 | Katada et al. ............... 257/371 |
| 5,754,467 A | * | 5/1998 | Ikeda et al. ................. 365/154 |
| 5,956,269 A | | 9/1999 | Ouyang et al. |
| 6,038,168 A | | 3/2000 | Allen et al. |
| 6,262,911 B1 | * | 7/2001 | Braceras et al. ............ 365/154 |
| 6,269,032 B1 | * | 7/2001 | Takeuchi et al. ........ 365/230.06 |
| 6,288,969 B1 | * | 9/2001 | Gibbins et al. ......... 365/230.05 |
| 6,473,334 B1 | * | 10/2002 | Bailey et al. ................ 365/154 |
| 6,473,357 B1 | * | 10/2002 | Fan et al. ............... 365/230.05 |
| 6,535,453 B2 | * | 3/2003 | Nii et al. ................. 365/230.05 |
| 6,741,517 B1 | * | 5/2004 | Fisher et al. ........... 365/230.05 |
| 6,906,953 B2 | | 6/2005 | Forbes |
| 6,906,962 B2 | | 6/2005 | Layman et al. |
| 6,909,635 B2 | | 6/2005 | Forbes et al. |
| 7,042,792 B2 | * | 5/2006 | Lee et al. .............. 365/230.05 |

FOREIGN PATENT DOCUMENTS

| | | |
|---|---|---|
| JP | 06-076582 | 3/1994 |
| WO | WO 2004/057621 | 7/2004 |

OTHER PUBLICATIONS

Enomoto Tadayoshi, "CMOS Integrated Circuit: Introduction to Specification", Baifukan, 1996.
E. Seevinck et al., "Static-Noise Margin Analysis of MOS SRAM Cells", IEEE Journal of Solid-State Circuits, vol. sc-22, No. 5, Oct. 1987, pp. 748-754.

* cited by examiner

*Primary Examiner*—Trong Phan
(74) *Attorney, Agent, or Firm*—Ladas & Parry LLP

(57) ABSTRACT

A nonvolatile memory circuit includes a flip-flop to degrade an internal circuit irreversibly based on a voltage applied to a first or second bit line so as to latch data in a nonvolatile manner, a first switch coupled between a first output terminal of the flip-flop and the first bit line, a second switch coupled between the first output terminal of the flip-flop and the first bit line, a third switch coupled between a second output terminal of the flip-flop outputting an inverse of an output of the first output terminal and the second bit line, and a fourth switch coupled between the second output terminal of the flip-flop and the second bit line.

18 Claims, 10 Drawing Sheets

NONVOLATILE MEMORY CIRCUIT

BACKGROUND OF THE INVENTION

1. Field of the Invention

The present invention generally relates to nonvolatile memory circuits and nonvolatile memory devices, and particularly relates to a nonvolatile memory circuit and nonvolatile memory device that can store data without a power supply voltage applied thereto.

2. Description of the Related Art

Conventionally, nonvolatile memories that can be electrically written and store data even when the power supply is turned off include EEPROM, FeROM, MRAM, etc.

FIG. 1 is a drawing showing a basic construction of an EEPROM memory cell. FIG. 2 is a circuit diagram of an EEPROM memory cell.

As shown in FIG. 1, an EEPROM memory cell 1 has a structure in which a gate electrode 2 called a floating gate electrically insulated from other parts and a gate electrode 3 of a conventional MIS-type transistor called a control gate are stacked one over another (see Patent Document 1, for example). In respect of the memory cell 1, as shown in FIG. 2, the gate electrode 3 is connected to a word line WL, and a source (N+ shown In FIG. 1) and a drain (N+ shown in FIG. 1) formed in a substrate (P-sub shown in FIG. 1) connect between a bit line BL and a plate line PL.

At the time of data writing, electrons generated by the hot-carrier effect are trapped in the floating electrode. At the time of data erasure, electrons are removed from the floating electrode by use of a tunnel current.

Since EEPROM has a special memory cell structure as shown in FIG. 2, a large number of manufacturing steps need to be added to the manufacturing steps of general-purpose logic circuits. Further, the retention of data is dependent on how satisfactory the electrical insulating property of the floating gate is, so that highly accurate management is necessary to monitor the manufacturing steps. Because of these factors, logic integrated circuits having EEPROM implemented thereon are not stable in terms of their yield, and have the problem of high cost.

The same issues also exist in the case of FeRAM and MRAM. The ferroelectric materials used in FeROM and the magnetic materials used in MRAM are not used in the manufacturing of conventional semiconductors. When logic integrated circuits having FeROM or MRAM memory implemented thereon are to be manufactured, thus, there is a need to incorporate the manufacturing steps of forming the memory into the manufacturing steps of the logic integrated circuits. Further, there are enormous difficulties in stabilizing the yield.

Attempts have been made to devise a method by which a nonvolatile memory circuit is obtained by use of the manufacturing steps of general-purpose logic integrated circuits.

FIG. 3 is a drawing showing a circuit configuration of an example of a conventional nonvolatile memory circuit.

A nonvolatile memory circuit 11 shown in FIG. 3 has a flip-flop 12 comprised of transistors PMmn(0+), PMmn(0−), NMmn(0+), and NMmn(0−). A first output terminal of the flip-flop 12 is coupled to a bit line BL+ via a transistor SWmn(o+), and a second output terminal of the flip-flop 12 is coupled to a bit line BL− via a transistor SWmn(o−). The nonvolatile memory circuit 11 is configured such that one bit per cell is stored by causing a hot-carrier-effect-based irreversible degradation to the transistor NMmn(o−) or NMmn(o+), which is one of the NMOS transistors (see Patent Document 1, for example).

FIG. 4 is a timing chart showing the writing of nonvolatile data according to an example of the conventional nonvolatile memory circuit.

When nonvolatile data is to be written, as shown in period T1 of FIG. 4, a power supply line SAM is biased to 5 V, and a power supply line SAP is biased to 1.5 V, for example. The terminals of the transistors NMmn(o+) and NMmn(o−) connected to the power supply line SAN serve as drain terminals.

In this case, the potential Vn(o−) of the bit line BL− is a ground potential, and the potential Vn(o+) of the bit line BL+ is 1.5 V, for example. When the potential Vm(i) of the word line WL is biased to 1.5 V, the transistor SWmn(o+) and the transistor SWmn(o−) are both tuned on. As a result, a higher voltage is applied between the source and drain of the transistor NMmn(o−) than between the source and drain of the transistor NMmn(o+). Since the bit line potential Vn(o−) is the ground potential, and the bit line potential Vn(o+) is 1.5 V, the transistor NMmn(o−) is in the ON state, and the transistor NMmn(o+) is in the OFF state. Due to the effects of these, a strong hot-carrier effect is generated in the transistor NMmn(o−), which results in the transistor NMmn(o−) being degraded to achieve nonvolatile storage.

FIG. 5 is a timing chart showing the reading of nonvolatile data according to an example of the conventional nonvolatile memory circuit.

At time t1, a state transition occurs from the state in which the power supply line SAP and the power supply line SAN are at the same potential to the state in which the power supply line SAP is at a higher potential than is the power supply line SAN. In response, the non-inverted output potential V(o+) and V(o−) of the flip-flop 12 initially in the indeterminate state are latched to become specific potentials. When this happens, a data latch state is restored that corresponds to the unbalance of the transistor NMmn(o−) and the transistor NMmn(o+). In this case, the transistor NMmn(o−) has a decreased drain current due to the hot-carrier effect, so that the power to pull down the inverted output potential V(o−) to the ground side is weaker than that of the transistor NMmn(o+). Namely, the inverted output potential V(o−) of the flip-flop 12 is latched to the high level, and the non-inverted output potential V(o+) of the flip-flop 12 is latched to the low level.

The operations described above achieve nonvolatile storage.

[Non Patent Document 1] Enomoto Tadayoshi, "CMOS Integrated Circuit: Introduction to Specification", Baifukan 1996

[Patent Document 1] Japanese Patent Application Publication 6-76582

The nonvolatile memory circuit shown in FIG. 3 has a problem as follows. In order to generate a hot-carrier effect in the transistor NMmn(o−) or the transistor NMmn(o+), there is a need to apply a sufficiently high voltage between the source and drain of the transistor. As described in Patent Document 1, thus, it is necessary to design the circuit such that the conductance of the transistor NMmn(o−) and the transistor NMmn(o+) is sufficiently smaller than the conductance of the transistor SWmn(o+) and the transistor SWmn(o−).

As is well known from the viewpoint of the design and optimization of SRAM, the attainment of stable operation of SRAM at the time of read operation requires a sufficient static noise margin. In order to achieve this, the circuit has to be designed such that the conductance of the transistor NMmn(o−) and the transistor NMmn(o+) is sufficiently larger than the conductance of the transistor SWmn(o+) and the transistor SWmn(o−). The optimization of such circuit design is called Static Noise Margin, which is described in detail in E. Seevinck et al. "Static-Noise Margin Analysis of MOS SRAM Cells," IEEE Journal of Solid-state Circuits Vol. SC-22, No. 5, Oct. 1987, pp. 748-754.

The operation to transfer the information represented by the latched potentials to the bit lines is performed by placing the two bit lines in an equal potential, with the potential Vm(i) of the word line WL being set to 1.5 V to turn on the transistor SWmn(o+) and the transistor SWmn(o−). In this operation, however, if the bit lines BL+ and BL− are at the equal potential, and the transistor SWmn(o+) and the transistor SWmn(o−) are in the state of having a low ON resistance, the inverted output potential V(o−) of the flip-flop 12 and the non-inverted output potential v(o+) are pulled by the potentials of the bit lines, resulting in the destruction of the latched state stored as the potential V(o−) and the potential V(o+). Namely, an event occurs in which the restored nonvolatile data cannot be transferred stably to the outside circuit.

As described above, in respect of the nonvolatile memory circuit shown in FIG. 3, the transistor design requirements are contradictory between the write operation and the read operation.

SUMMARY OF THE INVENTION

It is a general object of the present invention to provide a nonvolatile memory circuit and nonvolatile memory device that substantially obviates one or more problems caused by the limitations or disadvantages of the related art.

It is another and more specific object of the present invention to provide a nonvolatile memory circuit and nonvolatile memory device that can optimally perform write/read operation.

The present invention is characterized in that a nonvolatile memory circuit includes a flip-flop to degrade an internal circuit irreversibly based on a voltage applied to a first or second bit line so as to latch data in a nonvolatile manner, a first switch coupled between a first output terminal of the flip-flop and the first bit line, a second switch coupled between the first output terminal of the flip-flop and the first bit line, a third switch coupled between a second output terminal of the flip-flop outputting an inverse of an output of the first output terminal and the second bit line, and a fourth switch coupled between the second output terminal of the flip-flop and the second bit line.

The first and third switches are turned ON at a time of data write, and the second and fourth switches are turned on at least at a time of data read.

Further, the present invention is characterized in that the first and third switches have ON resistances smaller than ON resistances of the second and fourth switches.

The first through fourth switches are formed of MIS transistors, and a ratio between a gate width and a gate length is controlled with respect to the MIS transistors such as to set ON resistances of the first through fourth switches.

The second and fourth switches are turned on also at the time of data write.

The flip-flop includes a first CMIS-type inverter comprising a first PMIS-type transistor and a first NMIS-type transistor whose conductance is irreversibly changeable based on a hot-carrier effect, and a second CMIS-type inverter comprising a second PMIS-type transistor and a second NMIS-type transistor whose conductance is irreversibly changeable based on a hot-carrier effect, the second CMIS-type inverter having an input terminal thereof connected to an output terminal of the first CMIS-type inverter, and having an output terminal thereof connected to an input terminal of the first CMIS-type inverter.

Moreover, the present invention is characterized in that a nonvolatile memory circuit includes a flip-flop coupled to first through fourth bit lines to degrade an internal circuit based on voltages applied to the first through fourth bit lines so as to latch data, a first switch coupled between a first output terminal of the flip-flop and the first bit line, a second switch coupled between the first output terminal of the flip-flop and the second bit line, a third switch coupled between a second output terminal of the flip-flop outputting an inverse of an output of the first output terminal and the third bit line, and a fourth switch coupled between the second output terminal of the flip-flop and the fourth bit line.

The first and third switches are turned ON at a time of data write, and the second and fourth switches are turned on at least at a time of data read.

The first and third switches have ON resistances smaller than ON resistances of the second and third switches.

The first through fourth switches are formed of MIS transistors, and a ratio between a gate width and a gate length is controlled with respect to the MIS transistors such as to set the ON resistances of the first switch and the third switch and the ON resistances of the second switch and the fourth switch.

The second and fourth switches are turned on at the time of data write.

The flip-flop includes a first CMIS-type inverter comprising a first PMIS-type transistor and a first NMIS-type transistor whose conductance is irreversibly changeable based on a hot-carrier effect, and a second CMIS-type inverter comprising a second PMIS-type transistor and a second NMIS-type transistor whose conductance is irreversibly changeable based on a hot-carrier effect, the second CMIS-type inverter having an input terminal thereof connected to an output terminal of the first CMIS-type inverter, and having an output terminal thereof connected to an input terminal of the first CMIS-type inverter.

The first and third bit lines have wire widths thicker than wire widths of the second and fourth bit lines.

Further, the present invention is characterized in that a nonvolatile memory device includes a driver circuit, first and second bit lines extending from the driver circuit, word lines extending from the driver circuit, power supply lines extending from the driver circuit, and a memory cell array having a plurality of nonvolatile memory circuits arranged in matrix form connected to the bit lines, the word lines, and the power supply lines, wherein the nonvolatile memory circuits include a flip-flop to degrade an internal circuit irreversibly based on voltages supplied from the power supply lines and the first and second bit lines so as to latch data in a nonvolatile manner, a first switch coupled between a first output terminal of the flip-flop and the first bit line, a second switch coupled between the first output terminal of the flip-flop and the first bit line, a third switch coupled between a second output terminal of the flip-flop outputting an inverse of an output of the first output terminal and the second bit line, and a fourth switch coupled between the second output terminal of the flip-flop and the second bit line.

The driver circuit applies a high voltage to the power supply lines, turns on at least the first and third switches, and applies voltages responsive to data to the first and second bit lines when writing data to the nonvolatile memory circuits A nonvolatile memory device includes a driver circuit, first through fourth bit lines extending. from the driver circuit, word lines extending from the driver circuit, power supply lines extending from the driver circuit, and a memory cell array having a plurality of nonvolatile memory circuits arranged in matrix form connected to the bit lines, the word lines, and the power supply lines, wherein the nonvolatile memory circuits include a flip-flop coupled to the first through fourth bit lines to degrade an internal circuit based on voltages supplied from the power supply lines and the first through fourth bit lines so as to latch data, a first switch coupled between a first output terminal of the flip-flop and the first bit line, a second switch coupled between the first output terminal of the flip-flop and the second bit line, a third switch coupled between a second output terminal of the flip-flop outputting an inverse of an output of the first output terminal and the third bit line, and a fourth switch coupled between the second output terminal of the flip-flop and the fourth bit line.

The driver circuit applies a high voltage to the power supply lines, turns on at least the first and third switches, and applies voltages responsive to data to the first and third bit lines when writing data to the nonvolatile memory circuits.

The first and third bit lines have wire widths thicker than wire widths of the second and fourth bit lines.

Moreover, the present invention is characterized in that a nonvolatile memory device includes a driver circuit, bit lines extending from the driver circuit, word lines extending from the driver circuit, power supply lines extending from the driver circuit, and a memory cell array having a plurality of nonvolatile memory circuits arranged in matrix form connected to the bit lines, the word lines, and the power supply lines, wherein the nonvolatile memory circuits include a flip-flop coupled to the first through fourth bit lines to degrade an internal circuit based on voltages supplied from the power supply lines and the first through fourth bit lines so as to latch data, a first switch coupled between a first output terminal of the flip-flop and the first bit line, a second switch coupled between the first output terminal of the flip-flop and the second bit line, a third switch coupled between a second output terminal of the flip-flop outputting an inverse of an output of the first output terminal and the third bit line, and a fourth switch coupled between the second output terminal of the flip-flop and the fourth bit line.

The driver circuit applies a high voltage to the power supply lines, turns on at least the first and third switches, and applies voltages responsive to data to the first and third bit lines when writing data to the nonvolatile memory circuits.

According to at least one embodiment of the present invention, the optimum circuit conditions for writing to the memory cells by a hot-carrier effect and the optimum circuit conditions for reading data stably from the memory cells are both satisfied at the same time, and the nonvolatile memory can be manufactured by use of the manufacturing steps of general-purpose logic integrated circuit.

DESCRIPTION OF THE PREFERRED EMBODIMENTS

In the following, embodiments of the present invention will be described with reference to the accompanying drawings.

First Embodiment

Figure 1:
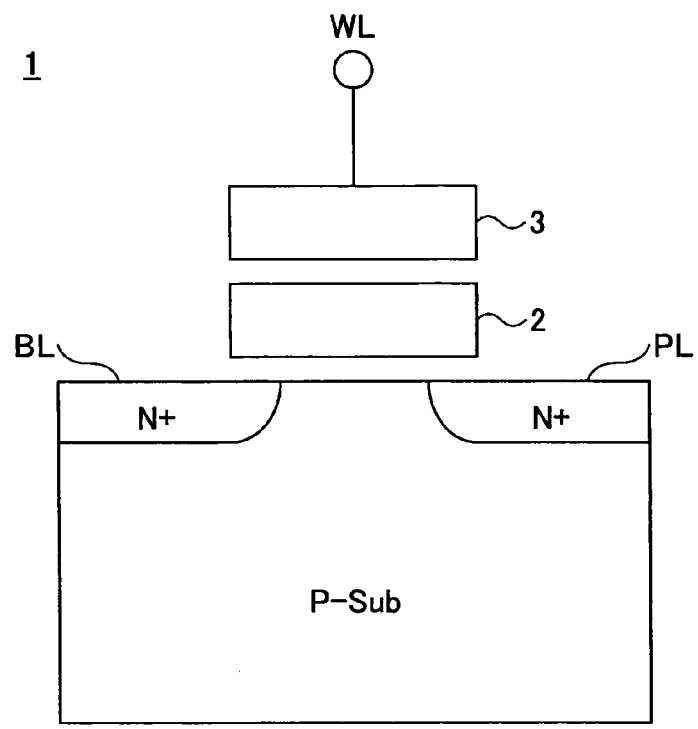
FIG. 1 is a drawing showing a basic construction of an EEPROM memory cell.
Figure 2:
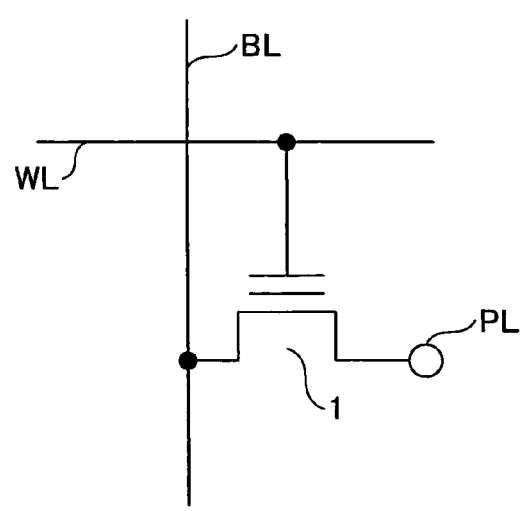
FIG. 2 is a circuit diagram of an EEPROM memory cell.
Figure 3:
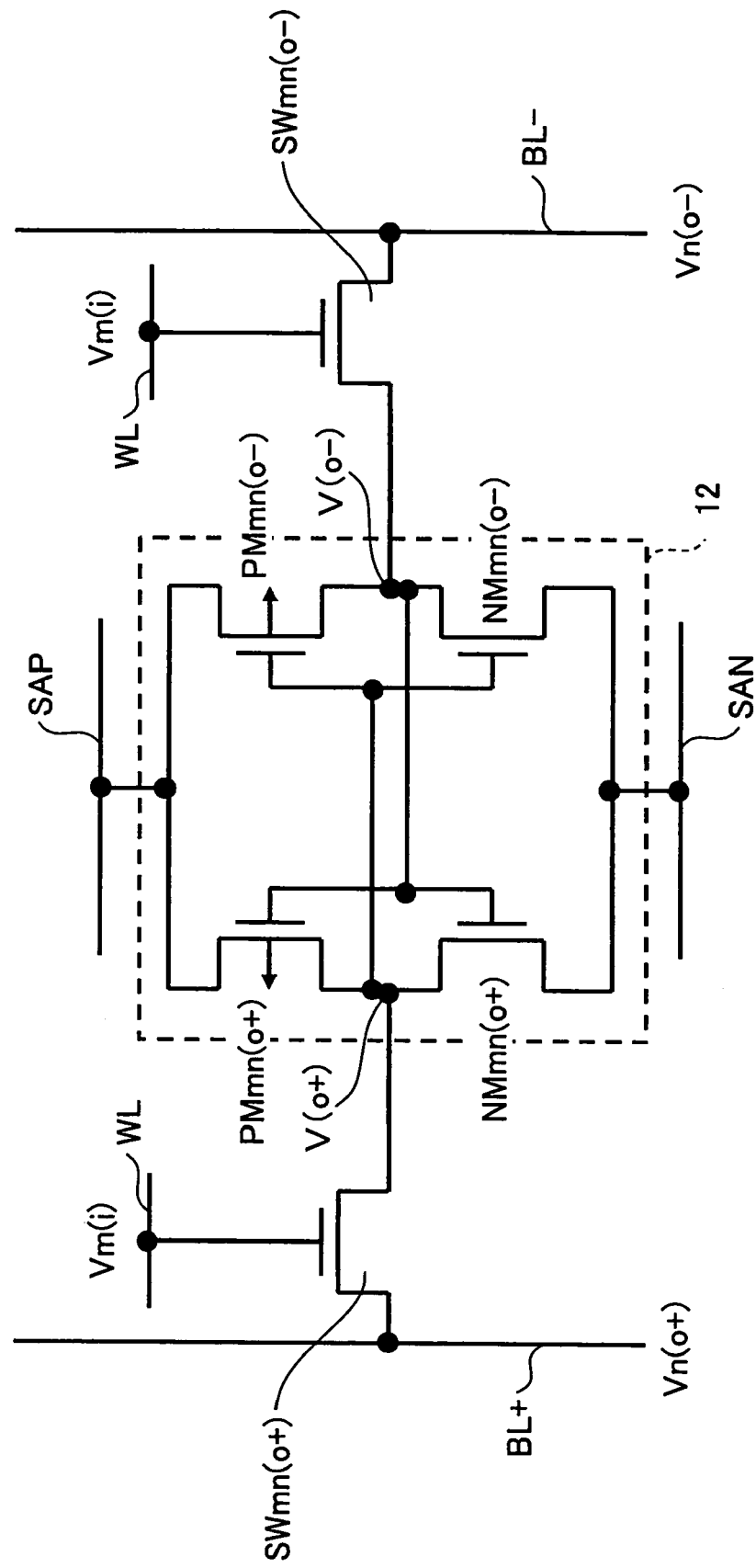
FIG. 3 is a drawing showing a circuit configuration of an example of a conventional nonvolatile memory circuit.
Figure 4:
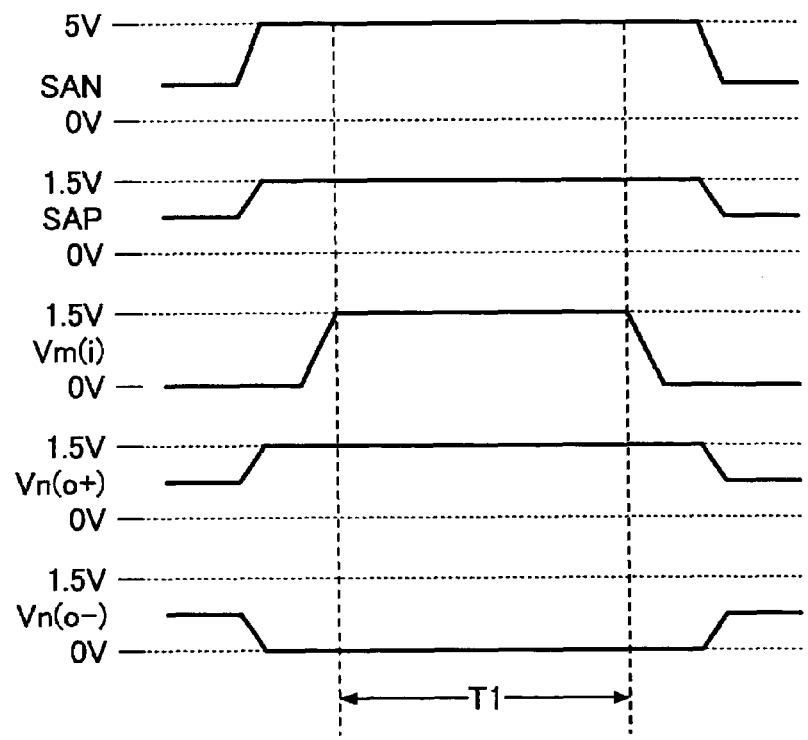
FIG. 4 is a timing chart showing the writing of nonvolatile data according to an example of the conventional nonvolatile memory circuit.
Figure 5:
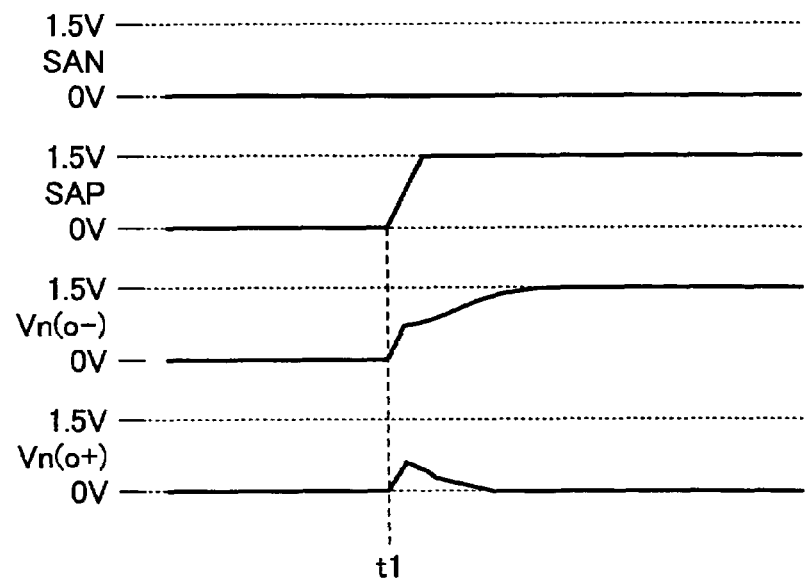
FIG. 5 is a timing chart showing the reading of nonvolatile data according to an example of the conventional nonvolatile memory circuit.
Figure 6:
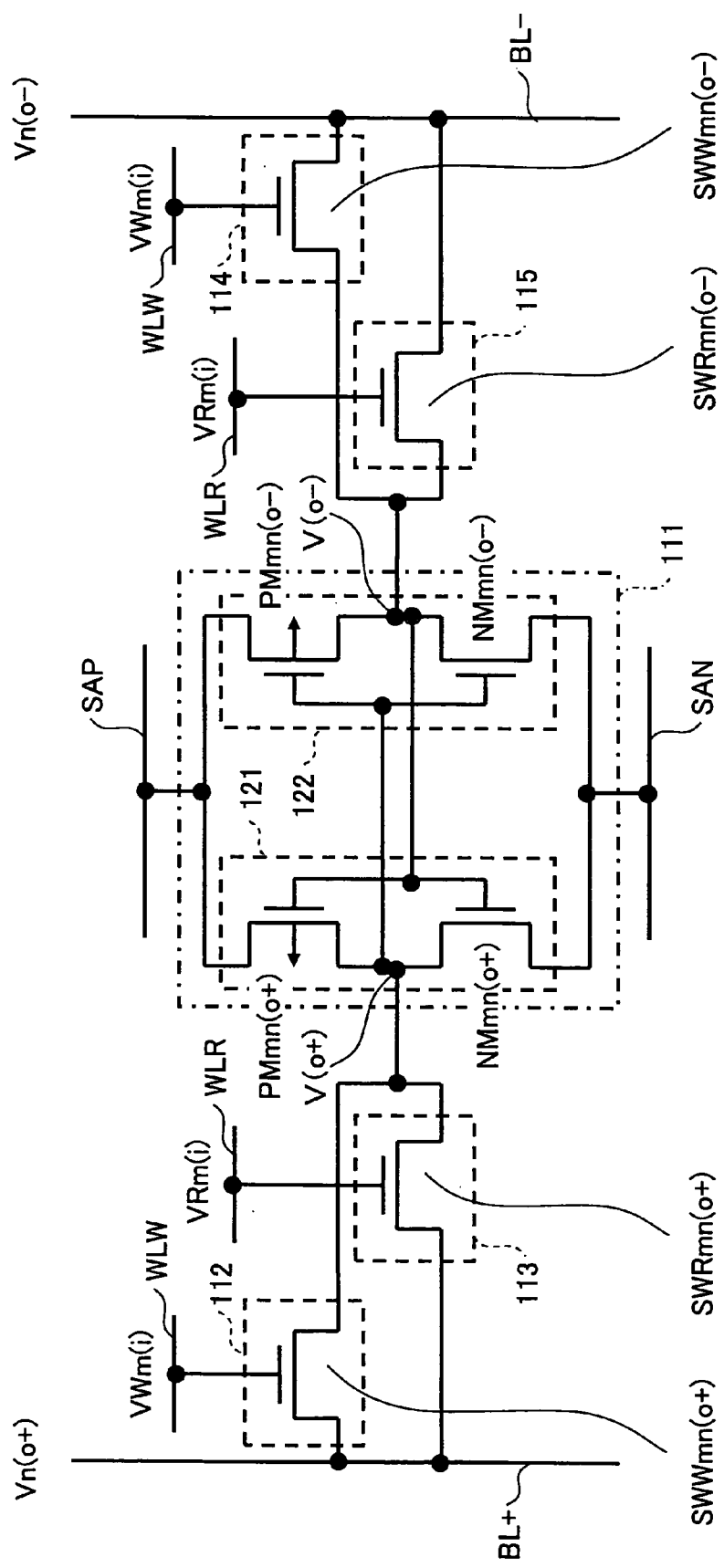
FIG. 6 is a diagram showing a circuit configuration of a first embodiment of the present invention.

FIG. 6 is a diagram showing a circuit configuration of a first embodiment of the present invention. In the figure, the same elements as those of FIG. 1 are referred to by the same numerals.

A nonvolatile memory circuit 100 of this embodiment has a flip-flop-type memory cell structure, and includes a flip-flop 111, a first switch 112, a second switch 113, a third switch 114, and a fourth switch 115.

The flip-flop 111 has a configuration in which the output node of a first CMIS inverter 121 is connected to the output node of a second CMIS inverter 122, and the output node of the second CMIS inverter 122 is connected to the input node of the first CMIS inverter 121.

The first CMIS inverter 121 has a configuration in which the source-drain of the transistor PMmn(o+) and the source-drain of the transistor NMmn(o+) are connected in series between the power supply line SAP and the power supply line SAN. The joint point between the gate of the transistor PMmn(o+) and the gate of the transistor NMmn(o+) serves as an input node. The joint point between the source-drain of the transistor PMmn(o+) and the source-drain of the transistor NMmn(o+) serves as an output node.

The second CMIS inverter 122 has a configuration in which the source-drain of the transistor PMmn(o−) and the source-drain of the transistor NMmn(o−) are connected in series between the power supply line SAP and the power supply line SAN. The joint point between the gate of the transistor PMmn(o−) and the gate of the transistor NMmn (o−) serves as an input node. The joint point between the source-drain of the transistor PMmn(o−) and the source-drain of the transistor NMmn(o−) serves as an output node.

In this example, the output node of the first CMIS inverter serves as a first output terminal of the flip-flop 111, and the output node of the second CMIS inverter serves as a second output terminal of the flip-flop 111. Here, the first output terminal outputs a signal that is an inversion of the output signal of the first output terminal, and the second output terminal outputs a signal that is an inversion of the output signal of the first output terminal.

The first switch 112 is comprised of an N-channel MIS-type transistor SWWmn(o+). The transistor SWWmn(o+) has the source-drain thereof connected between the non-inverted bit line BL+ and the first output terminal of the flip-flop 111, and has the gate thereof connected to the word line WLW.

The second switch 113 is comprised of an NMIS transistor SWRmn(o+). The N-channel MIS-type transistor SWRmn(o+) has the source-drain thereof connected between the non-inverted bit line BL+ and the first output terminal of the flip-flop 111, and has the gate thereof connected to the word line WLR.

The third switch 114 is comprised of an N-channel MIS-type transistor SWWmn(o−). The transistor SWWmn(o−) has the source-drain thereof connected between the inverted bit line BL− and the second output terminal of the flip-flop 111, and has the gate thereof connected to the word line WLW.

The fourth switch 115 is comprised of an N-channel MIS-type transistor SWRmn(o−). The N-channel MIS-type transistor SWRmn(o−) has the source-drain thereof connected between the inverted bit line BL− and the second output terminal of the flip-flop 111, and has the gate thereof connected to the word line WLR.

With W denoting the gate width of a MIS transistor and L denoting the gate length of a MIS transistor, W/L of the transistor NMmn(o+) constituting the first CMIS inverter 121 and W/L of the NMIS transistor SWRmn(o+) constituting the second switch 113 are set to 2:1. W/L of the transistor NMmn(o+) constituting the first CMIS inverter 121 and W/L of the NMIS transistor SWWmn(o+) constituting the first switch 112 are set to 1:4.5.

With the settings as described above, the conductance G1+ of the transistor SWWmn(o+), the conductance G2+ of the transistor NMmn(o+), and the conductance G3+ of the transistor SWRmn(o+) are related as:

$G1+>G2+>G3+.$

Moreover, the transistor NMmn(o−) constituting the second CMIS inverter 122, the transistor SWRmn(o−) constituting the fourth switch 115, and the transistor SWWmn(o−) constituting the third switch 114 are set in the same manner as the transistor NMmn(o+), the transistor SWRmn(o+), and the transistor SWWmn(o+). The conductance G1− of the transistor SWW(o−) is the same conductance as the conductance G1+ of the transistor SWWmn(o+). The conductance G2− of the transistor NMmn(o−) is the same conductance as the conductance G2− of the transistor NMmn(o+). The conductance G3− of the transistor SWR(o−) has the same conductance as the transistor SWR(o+). The following setting is thus achieved.

$G1->G2->G3-$

With the configuration described above, the present embodiment ensures that the ON resistance of the transistor SWWmn(o+) and the transistor SWWmn(o−) is kept sufficiently lower than the ON resistance of the transistor NMmn(o+) and the transistor NMmn(o−). Further, the ON resistance of the transistors SWRmn(o+) and SWRmn(o−) is kept sufficiently higher than the ON resistance of the transistor NMmn(o+) and the transistor NMmn(o−).

Such settings are achieved by making the channel width of the transistors SWWmn(o+) and SWWmn(o−) smaller than the channel width of the transistors SWRmn(o+) and SWRmn(o−) and by making the channel length of the transistor SWWmn(o+) and the transistor SWWmn(o−) longer than the channel width of the transistors SWRmn(o+) and SWRmn(o−).

[Operation]
[Nonvolatile Data Write Operate]

Figure 7:
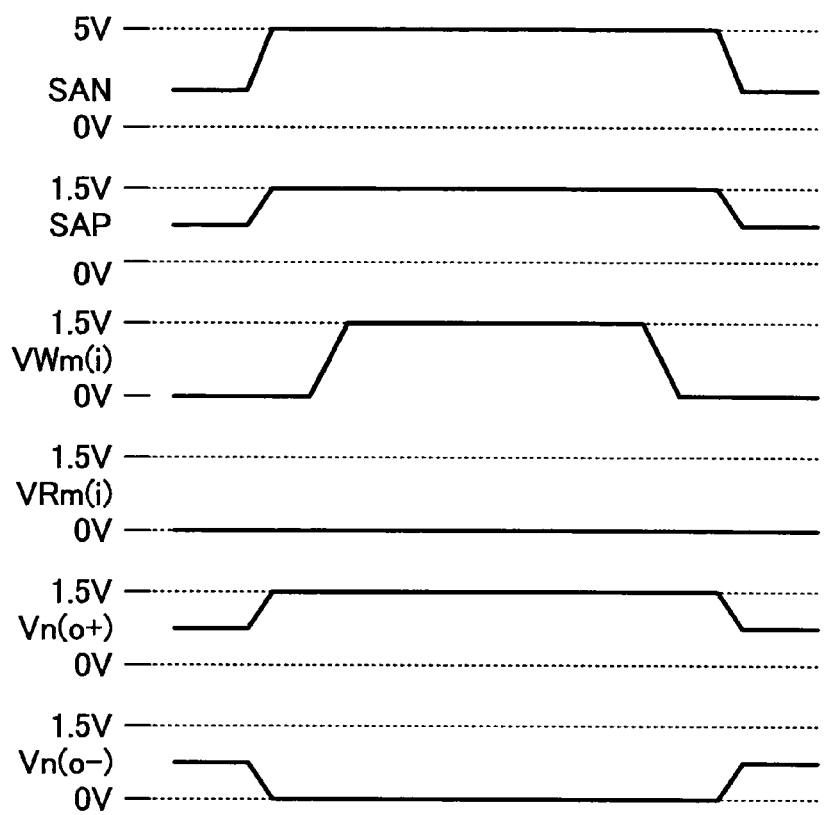
FIG. 7 is a timing chart of a nonvolatile data write operation according to the first embodiment of the present invention.

FIG. 7 is a timing chart of a nonvolatile data write operation according to the first embodiment of the present invention.

The power supply line SAN is at the ground potential when the circuit functions as a normal SRAM. As a result, the terminals of the transistors NMmn(o+) and NMmn(o−) that are connected to the power supply line SAN serve as a source.

When the writing of nonvolatile data is to be performed, the power supply line SAN is biased to 5 V, and the power supply line SAP is biased to 1.5 V, for example, with the terminals of the transistors NMmn(o+) and NMmn(o−) that are connected to the power supply line SAN serving as a drain. Further, the potential Vn(o−) of the bit line BL− is set to the ground potential, and the potential Vn(o+) of the bit line BL+ is set to 1.5 V.

When the potential VWm(i) of the word line WLw is biased to 1.5 V, the transistor SWWmn(o+) and the transistor SWWmn(o−) are turned on at the same time. As a result, a high voltage is applied across the source-drain of the transistor NMmn(o−). Since the potential Vn(o−) of the bit line BL− is at the ground potential, and the potential Vn(o+) of the bit line BL+ is at 1.5 V, the transistor NMmn(o−) is placed in the ON state, and the transistor NMmn(o+) is placed in the OFF state.

Because of this, a larger voltage than used during normal operation is applied to the transistor NMmn(o−), resulting in a strong hot-carrier effect occurring in the transistor NMmn(o−). This creates a nonreversible degradation in the transistor NMmn(o−). The nonreversible degradation in the transistor NMmn(o−) can achieve nonvolatile data storage.

During the operation described above, the potential VRm(i) of the word line WLR is kept at 0 V, so that the transistor SWRmn(o+) and the transistor SWRmn(o−) are turned off, and are thus controlled such as not to take part in the nonvolatile storage operation.

As described above, in order to generate a hot-carrier effect in the transistor NMmn(o−) during nonvolatile write operation, there is a need to make the ON resistance of the transistor SWWmn(o−) sufficiently small and to increase a potential difference between the potential of the power supply line SAN and the potential Vn(o−) of the bit line BL−, thereby achieving a sufficiently high voltage between the source-drain of the transistor NMmn(o−).

[Read Operation]

Figure 8:
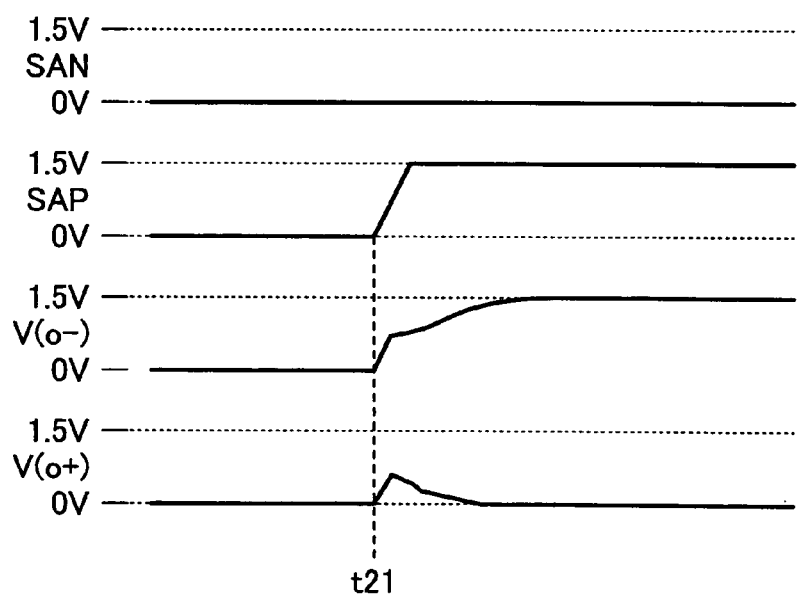
FIG. 8 is a timing chart showing an operation at the time of power-on of the memory cell circuit according to the first embodiment of the present invention.
Figure 9:
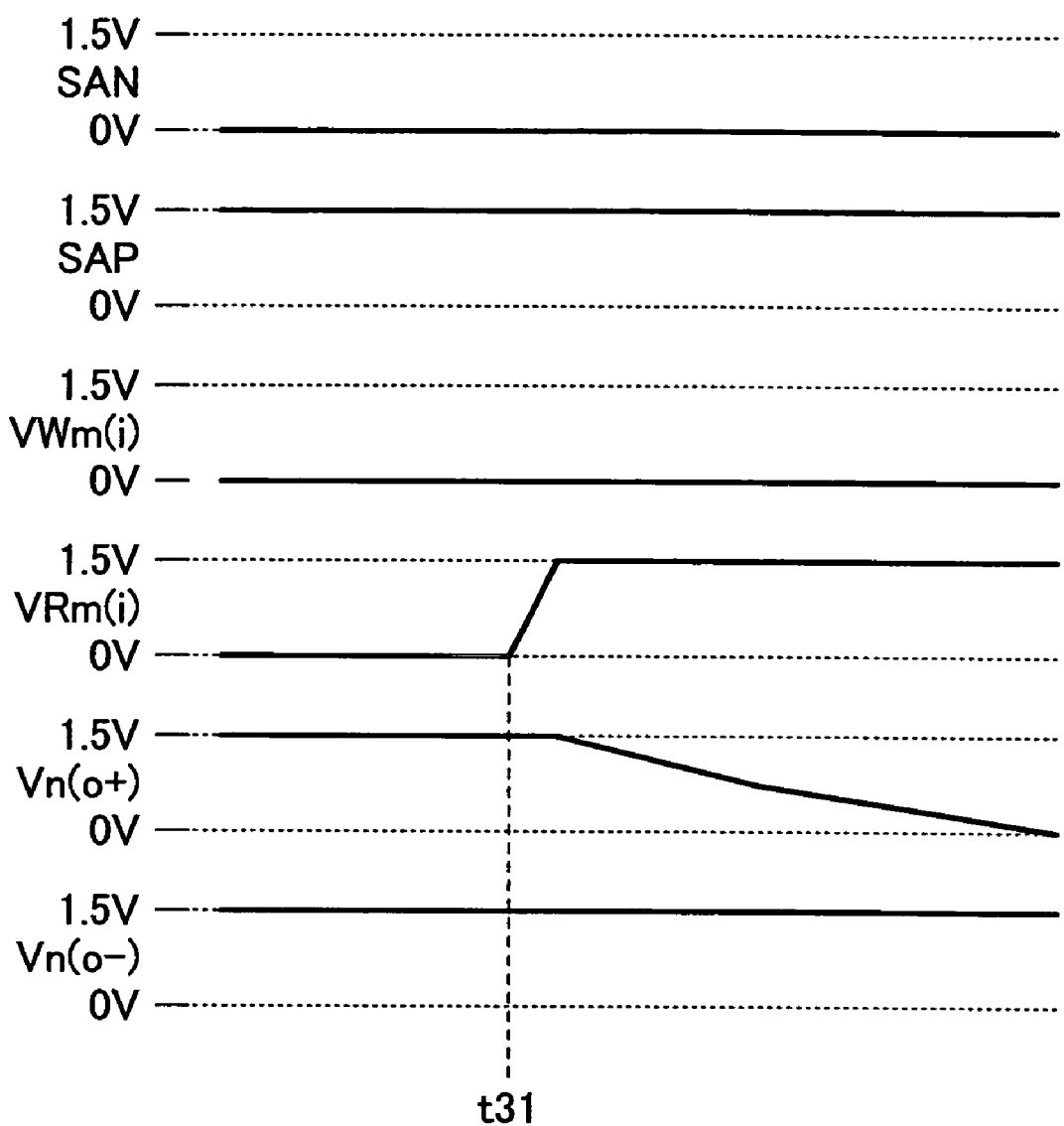
FIG. 9 is a timing chart of data transfer from the memory cell circuit to the bit lines according to the first embodiment of the present invention.

FIG. 8 is a timing chart showing an operation at the time of power-on of the memory cell circuit according to the first embodiment of the present invention. FIG. 9 is a timing chart of data transfer from the memory cell circuit to the bit lines according to the first embodiment of the present invention.

As shown in FIG. 8, at time t21, a state transition occurs from the state in which the power supply line SAP and the power supply line SAN are at the same potential to the state in which the power supply line SAP is at a higher potential than is the power supply line SAN. Since the power supply line SAP is placed in the state of being at a higher potential than is the power supply line SAN, the non-inverted output potential V(o+) and the inverted output potential V(o−) of the flip-flop 111 are changed from the indeterminate state to the latched state having specific potentials.

Since the transistor NMmn(o−) is degraded due to the hot-carrier effect during the nonvolatile write operation, its drain current is decreased compared with the drain current of the transistor NMmn(o+). As the drain current of the transistor NMmn(o−) decreases, the power to pull down the potential V(o−) to the ground side decreases compared to the transistor NMmn(o+). As a result, the inverted output potential V(o−) of the flip-flop 111 is latched to the high level, and the non-inverted output potential V(o+) is latched to the low level.

Unbalance is thus created between the drain current of the transistor NMmn(o−) and the drain current of the transistor NMmn(o+), thereby restoring the data latch.

Next, with the inverted output potential V(o−) and the non-inverted output potential V(o+) of the flip-flop 111 being latched, the potential Vn(o+) of the bit line BL+ and the potential Vn(o−) of the bit line BL− are placed at the same potential. After this, as shown in FIG. 9, the potential of the word line WLR is set to 1.5 V at time t31, thereby simultaneously turning on the transistor SWRmn(o+) and the transistor SWRmn(o−). Since the transistor SWRmn(o+) and the transistor SWRmn(o−) become conductive at the same time, data is transferred to the bit lines BL+ and BL−. This results in the potential Vn(o+) of the bit line BL+ being at the low level, and the potential Vn(o−) of the bit line BL− being at the high level.

To ensure that the latched state held in the inverted output potential V(o−) and the non-inverted output potential V(o+) of the flip-flop 111 be not destructed, the ON resistance of the transistors SWRmn(o+) and SWRmn(o−) is kept sufficiently higher than the ON resistance of the transistor NMmn(o+) and the transistor NMmn(o−).

According to the present embodiment, a sufficient source-drain voltage is applied to an NMIS-type transistor during write operation of the nonvolatile memory cell, thereby degrading the NMIS-type transistor that is targeted. At the same time, a sufficient static-noise margin is secured during read operation.

Second Embodiment

This embodiment uses the same configuration as that of the first embodiment, and differs in nonvolatile write operation. A description of the configuration will be omitted.

Figure 10:
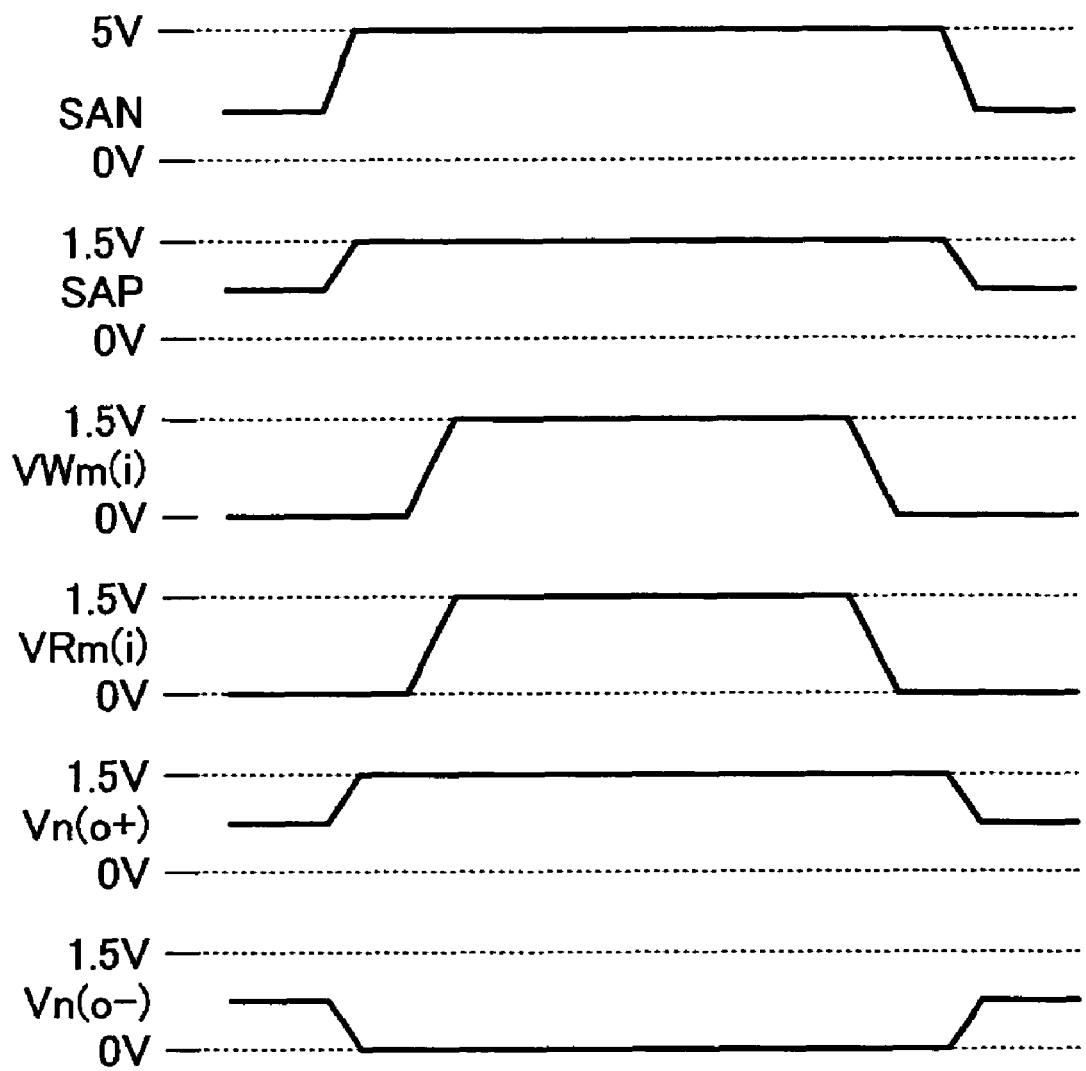
FIG. 10 is a timing chart of nonvolatile data-write operation according to the second embodiment of the present invention.

FIG. 10 is a timing chart of nonvolatile data-write operation according to the second embodiment of the present invention.

When a nonvolatile data write operation is to be performed in the present embodiment, the power supply line SAN is biased to a plus-side high potential such as 5 V, so that the terminals of the transistors NMmn(o+) and NMmn(o−) connected to the power supply line SAN are made to function as a drain node. Further, the potential Vn(o−) of the bit line BL− is set to the ground potential, and the potential Vn(o+) of the bit line BL+ is set to 1.5 V.

In the present embodiment, the potential VWm(i) of the word line WLW and the potential VRm(i) of the word line WLR are biased to 1.5 V. The transistors SWWmn(o+) and SWWmn(o−) and the transistors SWRmn(o+) and SWRmn(o−) are both placed in the conductive state. As a result, a higher voltage is applied across the source-drain of the transistor NMmn(o−) than across the source-drain of the transistor NMmn(o+).

According to the present embodiment, a stronger hot-carrier effect occurs in the transistor NMmn(o−), thereby achieving a stronger nonvolatile storage based on its irreversible nature. This attains reliable nonvolatile data storage.

Third Embodiment

Figure 11:
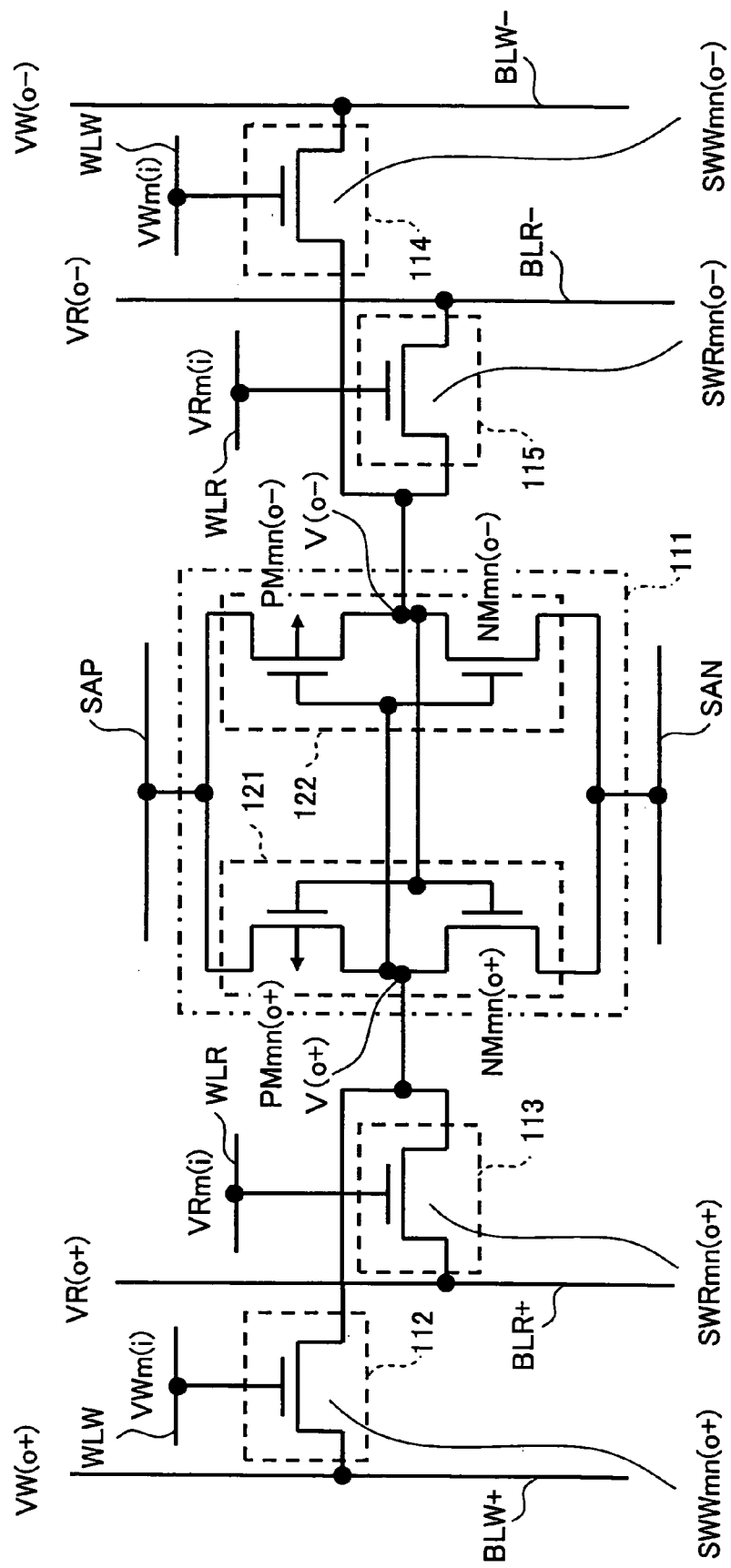
FIG. 11 is a drawing showing a circuit configuration of a third embodiment of the present invention.

FIG. 11 is a drawing showing a circuit configuration of a third embodiment of the present invention. In the figure, the same elements as those of FIG. 6 are referred to by the same numerals, and a description thereof will be omitted.

A nonvolatile memory circuit 200 of this embodiment is provided with data-read-purpose bit lines BLR+ and BLR− and nonvolatile-write-purpose bit lines BLW+ and BLW−. The source-drain of the transistor SWWmn(+) are connected between the data-read-purpose bit line BLR+ and the non-inverted output of the flip-flop 111. The source-drain of the transistor SWRmn(+) are connected between the nonvolatile-write-purpose bit line BLW+ and the non-inverted output of the flip-flop 111. The source-drain of the transistor SWWmn(−) are connected between the data-read-purpose bit line BLR− and the inverted output of the flip-flop 111. The source-drain of the transistor SWRmn(−) are connected between the nonvolatile-write-purpose bit line BLW− and the inverted output of the flip-flop 111.

According to the present embodiment, the data-read-purpose bit lines BLR+ and BLR− and the nonvolatile-write-purpose bit lines BLW+ and BLW− are provided, so that the wire width of the data-read-purpose bit lines BLR+ and BLR− can be set separately from the wire width of the nonvolatile-write-purpose bit lines BLW+ and BLW−.

For example, the data-read-purpose bit lines BLR+ and BLR− may be made thinner, and the nonvolatile-write-purpose bit lines BLW+ and BLW− may be made thicker. Making the data-read-purpose bit lines BLR+ and BLR− thinner can decrease the parasitic capacitance of the bit lines, which achieves higher data read speed. Making the non-volatile-write-purpose bit lines BLW+ and BLW− thicker can allow large currents to flow during data write operation, which achieves high-speed and reliable nonvolatile data writing.

[Example of Application]

The nonvolatile memory circuit as described above may be implemented in a nonvolatile memory device.

Figure 12:
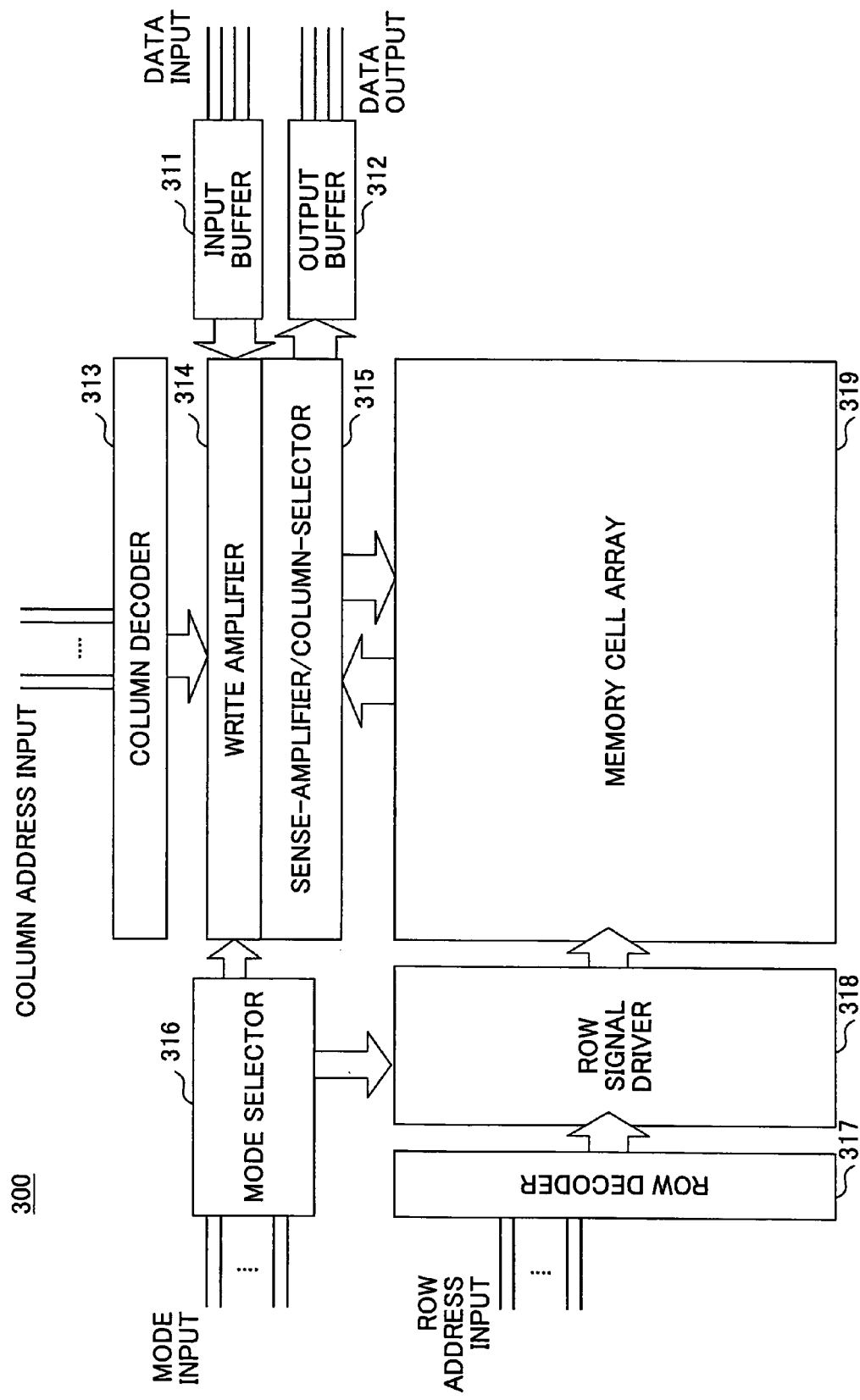
FIG. 12 is a block diagram of a nonvolatile memory device including the nonvolatile memory circuit of the present invention.

FIG. 12 is a block diagram of a nonvolatile memory device including the nonvolatile memory circuit 100 of the present invention.

A nonvolatile memory device 300 includes an input buffer 311, an output buffer 312, a column decoder 313, a write amplifier 314, a sense-amplifier/column-selector 315, a mode selector 316, a row decoder 317, a row signal driver 318, and a memory cell array 319.

The memory cell array 319 is configured by arranging a large number of the nonvolatile memory circuits 100 or 200 illustrated in FIG. 6 or FIG. 11 in matrix. Among the nonvolatile memory circuits 100 or 200, those nonvolatile memory circuits 100 or 200 which are arranged at the same column are connected to the same word line. Among the nonvolatile memory circuits 100 or 200, those nonvolatile memory circuits 100 or 200 which are arranged at the same row are connected to the same bit lines.

The mode selector 316 receives a mode switch signal from an exterior, and controls the write amplifier 314, the row signal driver 318, and the like in response to the received mode switch signal, thereby switching between operation modes such as the read-operation mode and the write operation mode.

The column decoder 313 receives a column address from an exterior, and enables the nonvolatile memory circuits 100 or 200 to operate at the column corresponding to the column address via the write amplifier 314 and the sense-amplifier/column-selector 315. The column decoder 313 receives a row address from an exterior, and enables the nonvolatile memory circuits 100 or 200 to operate at the row corresponding to the row address via the row signal driver 318.

Input data is supplied to the write amplifier 314 via the input buffer 311, and is written to the memory cell array 319 via the sense-amplifier/column-selector 315. Data stored in the memory cell array 319 is supplied to the output buffer 312 via the sense-amplifier/column-selector 315 to be read out to an exterior.

Figure 13:
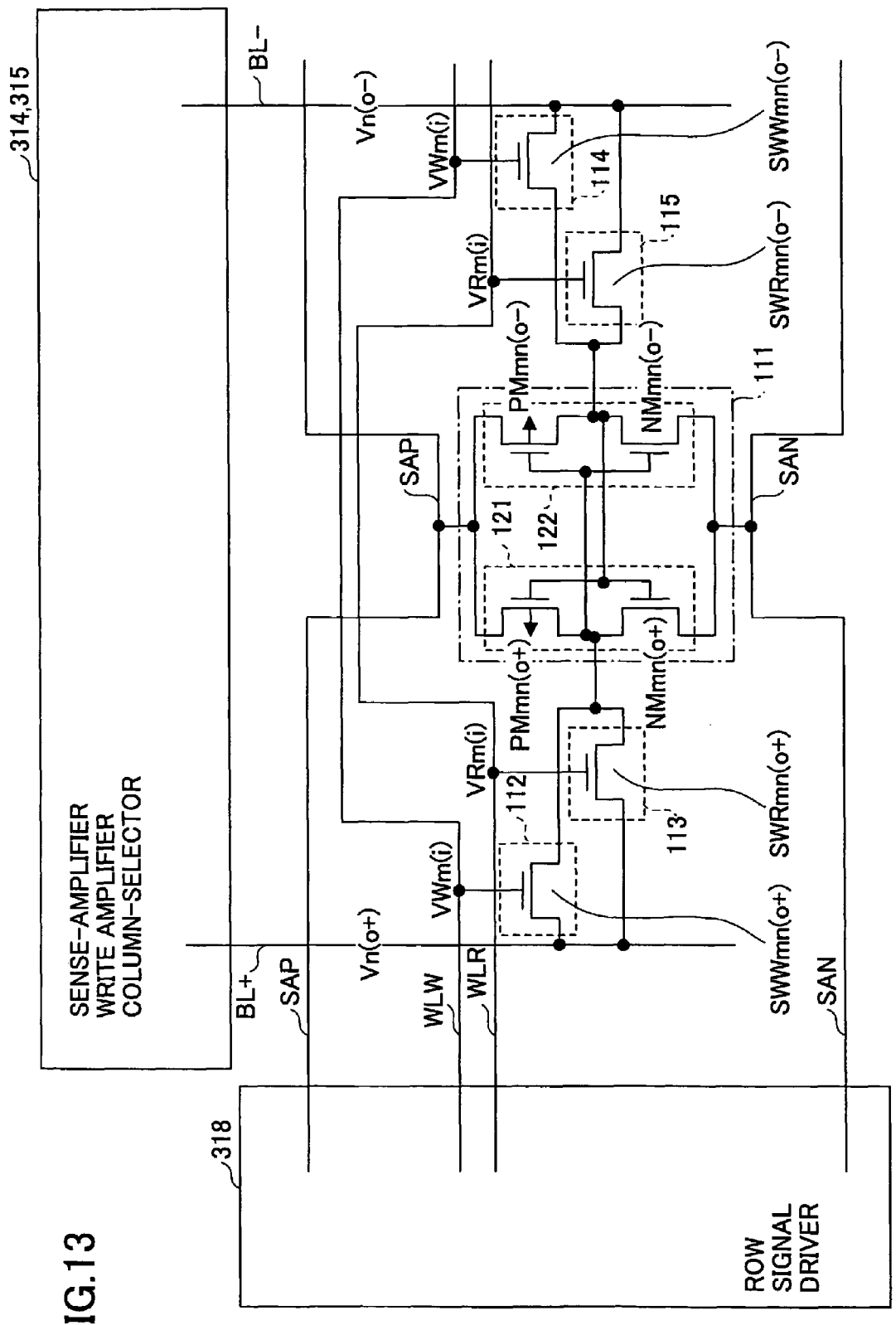
FIG. 13 is a diagram showing a circuit configuration of a main portion of the nonvolatile memory device.

FIG. 13 is a diagram showing a circuit configuration of a main portion of the nonvolatile memory device 300.

A pair of bit lines BL+ and BL− extends from the write amplifier 314 and the sense-amplifier/column-selector 315 separately for each column. The bit line BL+ is coupled to the first output terminal of the flip-flop 111 via the first switch 112 and the second switch 113 of the nonvolatile memory circuit 100. The bit line BL− is coupled to the second output terminal of the flip-flop 111 via the third switch 114 and the fourth switch 115 of the nonvolatile memory circuit 100. If the nonvolatile memory circuit 100 having the configuration shown in FIG. 11 is implemented, a set of bit lines BLW+, BLR+, BLW−, and BLR− extends from the write amplifier 314 and the sense-amplifier/column-selector 315 separately for each column. The bit line BLW+ is coupled to the first output terminal of the flip-flop 111 via the first switch 112 of the nonvolatile memory circuit 100. The bit line BLR+ is coupled to the first output terminal of the flip-flop 111 via the second switch 113 of the nonvolatile memory circuit 100. The bit line BLW− is coupled to the second output terminal of the flip-flop 111 via the third switch 114 of the nonvolatile memory circuit 100. The bit line BLR− is coupled to the inverted input node of the flip-flop 111 via the fourth switch 115 of the nonvolatile memory circuit 100.

The power supply lines SAP and SAN and the word lines WLW and WLR extend from the row signal driver 318. The flip-flop 111 is connected between the power supply line SAP and the power supply line SAN. The word line WLW is connected to the gate of the transistor SWWmn(+) constituting the first switch 112 and the gate of the transistor SWWmn(−) constituting the third switch 114. The word line WLR is connected to the gate of the transistor SWRmn(+) constituting the second switch 113 and the gate of the transistor SWRmn(−) constituting the fourth switch 115.

Further, the present invention is not limited to these embodiments, but various variations and modifications may be made without departing from the scope of the present invention.

What is claimed is:

1. A nonvolatile memory circuit, characterized by comprising:
   a first bit line;
   a second bit line;
   a first power supply line;
   a second power supply line;
   a first word line;
   a second word line;
   a flip-flop coupled to the first and second power supply lines and including MIS transistors;
   a first switch controlled through the first word line and coupled between a first output terminal of said flip-flop and said first bit line;
   a second switch controlled through the second word line and coupled between the first output terminal of said flip-flop and said first bit line;
   a third switch controlled through the first word line and coupled between a second output terminal of said flip-flop outputting an inverse of an output of the first output terminal and the second bit line;
   a fourth switch controlled through the second word line and coupled between the second output terminal of said flip-flop and the second bit line; and
   a row signal driver configured to, in a write mode, activate the first word line to turn on the first and third switches and drive the first and second power lines by write voltage levels to create a nonreversible hot-carrier-effect-based degradation in one of the MIS transistors that is selected in response to voltage levels of the first and second bit lines, said row signals driver further configured to, in a read mode, activate the second word line to turn on the second and fourth switches and drive the first and second power lines by read voltage levels to read, through the first and second bit lines, data responsive to the nonreversible hot-carrier-effect-based degradation created in one of the MIS transistors.

2. The nonvolatile memory circuit as claimed in claim 1, wherein the first and third switches are turned ON at a time of data write, and the second and fourth switches are turned on at least at a time of data read.

3. The nonvolatile memory circuit as claimed in claim 2, wherein the first and third switches have ON resistances smaller than ON resistances of the second and fourth switches.

4. The nonvolatile memory circuit as claimed in claim 3, wherein the first through fourth switches are formed of MIS transistors, and wherein a ratio between a gate width and a gate length is controlled with respect to the MIS transistors such as to set ON resistances of the first through fourth switches.

5. The nonvolatile memory circuit as claimed in claim 2, wherein the second and fourth switches are turned on also at the time of data write.

6. The nonvolatile memory circuit as claimed in claim 1, wherein said flip-flop includes:
   a first CMIS-type inverter comprising a first PMIS-type transistor and a first NMIS-type transistor whose conductance is irreversibly changeable based on a hot-carrier effect; and
   a second CMIS-type inverter comprising a second PMIS-type transistor and a second NMIS-type transistor whose conductance is irreversibly changeable based on a hot-carrier effect, said second CMIS-type inverter having an input terminal thereof connected to an output terminal of said first CMIS-type inverter, and having an output terminal thereof connected to an input terminal of said first CMIS-type inverter.

7. A nonvolatile memory circuit, characterized by comprising:
   a first power supply line;
   a second power supply line;
   a first word line;
   a second word line;
   a flip-flop coupled to first through fourth bit lines and to the first and second power supply lines and including MIS transistors;
   a first switch controlled through the first word line and coupled between a first output terminal of said flip-flop and said first bit line;
   a second switch controlled through the second word line and coupled between the first output terminal of said flip-flop and said second bit line;
   a third switch controlled through the first word line and coupled between a second output terminal of said flip-flop outputting an inverse of an output of the first output terminal and the third bit line;
a fourth switch controlled through the second word line and coupled between the second output terminal of said flip-flop and the fourth bit line; and
a row signal driver configured to, in a write mode, activate the first word line to turn on the first and third switches and drive the first and second power lines by write voltage levels to create a nonreversible hot-carrier-effect-based degradation in one of the MIS transistors that is selected in response to voltage levels of the first and third bit lines, said row signal driver further configured to, in a read mode, activate the second word line to turn on the second and fourth switches and drive the first and second power lines by read voltage levels to read, through the second and fourth bit lines, data responsive to the nonreversible hot-carrier-effect-based degradation created in one of the MIS transistors.

8. The nonvolatile memory circuit as claimed in claim 7, wherein the first and third switches are turned ON at a time of data write, and the second and fourth switches are turned on at least at a time of data read.

9. The nonvolatile memory circuit as claimed in claim 8, wherein the first and third switches have ON resistances smaller than ON resistances of the second and third switches.

10. The nonvolatile memory circuit as claimed in claim 9, wherein the first through fourth switches are formed of MIS transistors, and wherein a ratio between a gate width and a gate length is controlled with respect to the MIS transistors such as to set the ON resistances of the first switch and the third switch and the ON resistances of the second switch and the fourth switch.

11. The nonvolatile memory circuit as claimed in claim 8, wherein the second and fourth switches are turned on at the time of data write.

12. The nonvolatile memory circuit as claimed in claim 7, wherein said flip-flop includes:
a first CMIS-type inverter comprising a first PMIS-type transistor and a first NMIS-type transistor whose conductance is irreversibly changeable based on a hot-carrier effect; and
a second CMIS-type inverter comprising a second PMIS-type transistor and a second NMIS-type transistor whose conductance is irreversibly changeable based on a hot-carrier effect, said second CMIS-type inverter having an input terminal thereof connected to an output terminal of said first CMIS-type inverter, and having an output terminal thereof connected to an input terminal of said first CMIS-type inverter.

13. The nonvolatile memory circuit as claimed in claim 7, wherein the first and third bit lines have wire widths thicker than wire widths of the second and fourth bit lines.

14. A nonvolatile memory device, characterized by comprising:
a driver circuit;
first and second bit lines extending from said driver circuit;
first and second word lines extending from said driver circuit;
first and second power supply lines extending from said driver circuit; and
a memory cell array having a plurality of nonvolatile memory circuits arranged in matrix form, one of which is connected to the first and second bit lines, the first and second word lines, and the first and second power supply lines,
wherein one of the said nonvolatile memory circuits includes:
a flip-flop coupled to the first and second power supply lines and including MIS transistors;
a first switch controlled through the first word line and coupled between a first output terminal of said flip-flop and said first bit line;
a second switch controlled through the second word line and coupled between the first output terminal of said flip-flop and said first bit line;
a third switch controlled through the first word line and coupled between a second output terminal of said flip-flop outputting an inverse of an output of the first output terminal the second bit line; and
a fourth switch controlled through the second word line and coupled between the second output terminal of said flip-flop and the second bit line,
and wherein the driver circuit is configured to, in a write mode, activate the first word line to turn on the first and third switches and drive the first and second power lines by write voltage levels to create a nonreversible hot-carrier-effect-based degradation in one of the MIS transistors that is selected in response to voltage levels of the first and second bit lines, and is further configured to, in a read mode, activate the second word line to turn on the second and fourth switches and drive the first and second power lines by read voltage levels to read, through the first and second bit lines, data responsive to the nonreversible hot-carrier-effect-based degradation created in one of the MIS transistors.

15. The nonvolatile memory device as claimed in claim 14, wherein said driver circuit applies a high voltage to the power supply lines, turns on at least the first and third switches, and applies voltages responsive to data to the first and second bit lines when writing data to said nonvolatile memory circuits.

16. A nonvolatile memory device, characterized by comprising:
a driver circuit;
first through fourth bit lines extending from said driver circuit;
first and second word lines extending from said driver circuit;
first and second power supply lines extending from said driver circuit; and
a memory cell array having a plurality of nonvolatile memory circuits arranged in matrix form one of which is connected to the first through fourth bit lines, the first and second word lines, and the first and second power supply lines,
wherein one of the said nonvolatile memory circuits include:
a flip-flop coupled to the first through fourth bit lines and to the first and second power supply lines and including MIS transistors;
a first switch controlled through the first word line and coupled between a first output terminal of said flip-flop and said first bit line;
a second switch controlled through the second word line and coupled between the first output terminal of said flip-flop and said second bit line;
a third switch controlled through the first word line and coupled between a second output terminal of said flip-flop outputting an inverse of an output of the first output terminal and the third bit line; and a fourth switch controlled through the second word line and coupled between the second output terminal of said flip-flop and the fourth bit line, and wherein the driver circuit is configured to, in a write mode, activate the first word line to turn on the first and third switches and drive the first and second power lines by write voltage levels to create a nonreversible hot-carrier-effect-based degradation in one of the MIS transistors that is selected in response to voltage levels of the first and third bit lines, and is further configured to, in a read mode, activate the second word line to turn on the second and fourth switches and drive the first and second power lines by read voltage levels to read, through the second and fourth bit lines, data responsive to the nonreversible hot-carrier-effect-based degradation created in one of the MIS transistors.

17. The nonvolatile memory device as claimed in claim 16, wherein said driver circuit applies a high voltage to the power supply lines, turns on at least the first and third switches, and applies voltages responsive to data to the first and third bit lines when writing data to said nonvolatile memory circuits.

18. The nonvolatile memory device as claimed in claim 16, wherein the first and third bit lines have wire widths thicker than wire widths of the second and fourth bit lines.

* * * * *